United States Patent [19]

Nagaishi et al.

[11] Patent Number: 5,231,075
[45] Date of Patent: Jul. 27, 1993

[54] PROCESS FOR PREPARING SUPERCONDUCTING OXIDE THIN FILMS

[75] Inventors: Tatsuoki Nagaishi; Hisao Hattori; Hideo Itozaki, all of Hyogo, Japan

[73] Assignee: Sumitomo Electric Industries, Ltd., Osaka, Japan

[21] Appl. No.: 713,490

[22] Filed: Jun. 12, 1991

[30] Foreign Application Priority Data

Jun. 13, 1990 [JP] Japan ................. 2-154208

[51] Int. Cl.$^5$ .................. B05D 3/06; B23K 26/12
[52] U.S. Cl. .................. 505/1; 219/121.63; 427/554
[58] Field of Search ......... 427/314, 53.1, 42, 554-558; 219/121.63, 121.69; 250/458.1; 505/1

[56] References Cited

U.S. PATENT DOCUMENTS

| | | | |
|---|---|---|---|
| 3,971,951 | 7/1976 | Rikukawa et al. | 250/458.1 |
| 4,604,294 | 8/1986 | Tanaka et al. | 427/53.1 |
| 4,909,895 | 3/1990 | Cusano | 427/53.1 |
| 4,945,204 | 7/1990 | Nakamura et al. | 219/121.69 |
| 4,987,007 | 1/1991 | Wagal et al. | 427/53.1 |
| 4,997,809 | 3/1991 | Gupta | 427/53.1 |
| 5,015,492 | 5/1991 | Venkatesan et al. | 427/53.1 |
| 5,019,552 | 5/1991 | Balooch et al. | 427/314 |

FOREIGN PATENT DOCUMENTS

| | | |
|---|---|---|
| 341520 | 11/1989 | European Pat. Off. . |
| 1-72504 | 3/1989 | Japan . |
| 2-104658 | 4/1990 | Japan . |

OTHER PUBLICATIONS

Wu et al., "Versatility of Pulsed Laser Deposition Technique for Preparation of High $T_c$ Superconducting Thin Films", *SPIE*, vol. 948, pp. 50–65.

Muenchausen et al., "Effects of Beam Parameters on Excimer Laser Deposition of $YBa_2Cu_3O_{7-\zeta}$", *Applied Physics Letters*, vol. 56, No. 7, pp. 578–580.

Dagani et al., "Improved Superconductor Properties, Technology Bring Applications Closer", *Chemical & Engineering News*, vol. 68, No. 1, pp. 24–27.

Eryu et al., "Formation of High $T_c$ Superconducting Films by Laser Induced Fragments", *Nuclear Instruments and Methods in Physics Research B*, vol. 39, No. 1–4, pp. 640–643.

*Primary Examiner*—Geoffrey S. Evans
*Attorney, Agent, or Firm*—Lowe, Price, LeBlanc & Becker

[57] ABSTRACT

A laser ablation process for preparing superconducting oxide thin films such as $YBa_2Cu_3O_{7-x}$ comprises ablating a target surface with pulsed laser beam to cause deposition of target molecules on a substrate. The incident laser beam on the target surface has an energy of 5 to 10 J/cm$^2$ per pulse.

4 Claims, 1 Drawing Sheet

PROCESS FOR PREPARING SUPERCONDUCTING OXIDE THIN FILMS

FIELD OF THE INVENTION

The present invention relates to processes for preparing superconducting oxide thin films. More particularly, the present invention relates to processes for preparing high-quality superconducting oxide thin films using laser ablation techniques.

BACKGROUND OF THE INVENTION

Laser ablation techniques are known for use in preparing thin films. Generally, a substrate and a target are arranged in a film-forming chamber which is evacuated to a high vacuum and is supplied with a desired ambient gas. Laser beam is emitted from a laser apparatus provided outside the film-forming chamber and is guided by an optical means to ablate the target. Lasers commonly used in these methods are capable of emitting pulsed beam having high peak power, examples Of which include $CO_2$ lasers and excimer lasers. These lasers provide incident laser beam energy on the target surface typically in the range of 1-2 $J/cm^2$ per pulse and on the order of 3.5 $J/cm^2$ per pulse at maximum.

These conventional laser ablation methods for preparing thin films are advantageous in providing easy compositional control of the formed thin films and in providing fast film formation. Additionally, laser ablation does not require the use of an electromagnetic field and therefore is suitable for preparing thin films of high quality. However, these methods of laser ablation are disadvantageous for forming thin films because a part of the target surface which is ablated with laser beam is melted, whereby the composition in the ablated area is changed. That is the energy of the incident laser beam is partially absorbed as thermal energy by the target to increase its temperature and change the composition in the ablated area. As a result, the composition of the thin film which is being deposited varies in the direction of the thickness of the film. Accordingly, it has been difficult to prepare homogeneous superconducting oxide thin films using conventional laser ablation methods.

Thus, a need exists for an improved process for laser ablation for forming high-quality thin films, and particularly high-quality superconducting oxide thin films.

SUMMARY OF THE INVENTION

Accordingly, it is an object of the present invention to provide an improved laser ablation process for preparing superconducting oxide thin films. It is a related object of the invention to provide a laser ablation process for preparing high-quality superconducting oxide thin films, which process overcomes the disadvantages of the prior art processes discussed above and results in the formation of homogeneous superconducting oxide thin films.

These and additional objects are provided by the process of the present invention for preparing superconducting oxide thin films. The process comprises ablating the surface of a target with pulsed laser beam to cause deposition of the target molecules on a substrate. In accordance with an important feature of the invention, the incident laser beam on the target surface has an energy of at least 5 $J/cm^2$ per pulse. Ablation of the target with laser beam having the high energy required by the present invention causes removal of molecules from the target without melting the target surface, thereby resulting in the deposition of a homogeneous superconducting oxide thin film.

These and additional objects and advantages will be more fully apparent in view of the following detailed description.

BRIEF DESCRIPTION OF THE DRAWING

The FIGURE sets forth a schematic diagram of the method according to the present invention.

DETAILED DESCRIPTION

Figure 1:
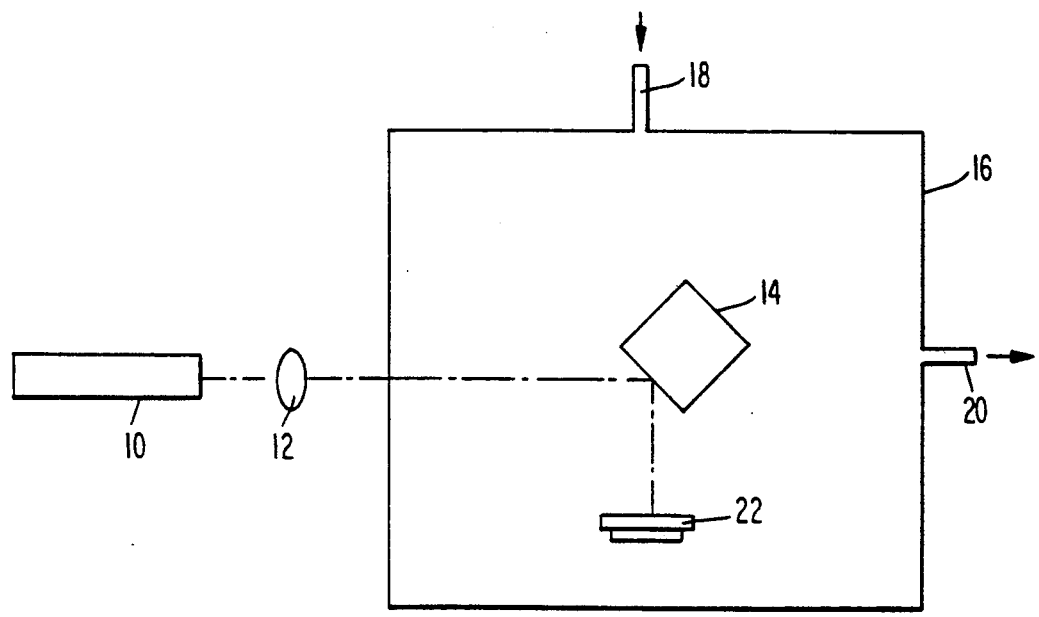

The present invention relates to a laser ablation process for preparing superconducting oxide thin films. The process comprises ablating a surface of a target with pulsed laser beam to cause deposition of the target molecules on a substrate. In accordance with an important feature, the incident laser beam on the target surface has an energy of at least 5 $J/cm^2$ per pulse.

The energy of the laser beam employed in the present process is of a much greater energy as compared with that employed in prior art laser ablation processes for forming thin films. In accordance with the present invention, the energy of the incident laser beam is dominantly absorbed to cause physical reactions as follows. When the target is ablated with laser beam of the higher energy of at least 5 $J/cm^2$ per pulse, the high energy first forces off the electrons in the target molecules. Then positively charged molecules in the target leave the target by ionic repulsion, and the target molecules are then deposited on the substrate. Owing to this mechanism, the area of the target which is ablated with the laser beam in the process of the present invention is not melted and, consequently, there is no change in the composition of the ablated area of the target. Accordingly, the thin film of superconducting oxide which is prepared by the process of the present invention has a homogeneous composition without any variation in the composition in the direction of the thickness of the thin film.

In order to ensure that molecules are forced off the target in the manner described above, the laser beam which is employed in the process of the present invention must have an energy of at least 5 $J/cm^2$ per pulse on the target surface. If the incident laser beam on the target surface has an energy which is less than 5 $J/cm^2$ per pulse, the part of the target surface will melt as molecules are removed from the surface.

In accordance with conventional methods, the laser ablation process of the invention is conducted in a film-forming chamber which is evacuated to a high vacuum and is supplied with a desired ambient gas. The laser beam is emitted from a laser apparatus provided outside the film-forming chamber and is guided by optical means to ablate the target. The target and the substrate are preferably arranged in face-to-face relation.

The laser beam which is employed to ablate the target surface in accordance with the present process may be provided by any suitable laser source, including, but not limited to, $CO_2$ lasers and excimer lasers. Additionally, for controlling the energy of laser beam, it is preferable to use not only a laser apparatus but also an optical condensing means which condenses the laser beam to be focused on the target surface. The condensing means may comprise a suitable optical means such as one or more high-quality synthetic quartz lenses provided with a non-reflective coating. Thus, the energy of ablating laser beam will be of the required value by condensing the laser beam to be effectively focused on the target.

The process of the present invention results in the formation of high-quality superconducting oxide thin films. The target which is employed in the present process may therefore comprise a superconducting oxide, for example a Y—Ba—Cu—O superconducting oxide, prepared, for example, by sintering methods known in the art.

The superconducting oxide thin films according to the present invention may be employed in various devices requiring superconducting oxide films, for example, electronic devices including, but not limited to, Josephson devices and superconducting transistors.

The following example illustrates the process of the present invention but is not intended to limit the scope of the present invention.

A schematic diagram of the methods of the invention is set forth in the FIGURE. With reference to the FIGURE, light from a laser 10 is directed through a lens 12 to a target 14 arranged in a vacuum chamber 16. The vacuum chamber 16 is supplied with an ambient gas through line 18, and a vacuum is provided through outlet 20. The incident laser light on the target 14 causes molecules to be deposited on a substrate 22 in the manner described above.

EXAMPLE

A thin film of $Y_1Ba_2Cu_3O_{7-x}$ superconducting oxide was prepared by the process of the present invention. For comparison purposes, an additional thin film of the recited composition was prepared by a prior art method. In the method of the present invention, the incident laser beam on the target surface had an energy of 10 J/cm$^2$. In the prior art method, the incident laser beam on the target surface had an energy of 0.7 J/cm$^2$. In both methods, a sinter of $Y_1Ba_2Cu_3O_{7-x}$ was used as a target. The film-forming chamber was evacuated to $1 \times 10^{-6}$ Torr, and oxygen gas was supplied to the chamber until the internal pressure thereof was 100 mToor. An excimer laser emitting beam at 193 nm was used as the laser apparatus. This laser produced laser beam having a peak power of 0.5 J/cm$^2$ per pulse and a rectangular pattern of radiation of $10 \times 50$ mm$^2$. In order to increase the energy density of the laser beam, the laser beam was condensed with synthetic quartz lenses so that the ablated area on the target was reduced to $1 \times 5$ mm$^2$. The films were formed under the following conditions:

Substrate: MgO (100)
Energy of laser beam:
  5 J/cm$^2$ (invention)
  10 J/cm$^2$
  4.5 J/cm$^2$ (Prior art)
  0.7 J/cm$^2$
O$_2$ gas are pressure 400 mTorr
Substrate temperature: 700° C.
Duration of film formation: 1 hour The resulting superconducting oxide thin films were examined under a transmission electron microscope and their superconducting characteristics were measured. The superconducting oxide thin film produced according to the process of the present invention exhibited a uniform crystalline structure across the 200 nm thickness of the film without any irregularities. The film also had few rough irregularities in the surface. The superconducting oxide thin film prepared by the prior art process also had a uniform crystalline structure but exhibited a great number of rough irregularities in its surface. The superconducting characteristics of the two films were as follows:

| Process | Energy of laser beam | Critical temperature (K) | Critical current density (A/cm$^2$) |
|---|---|---|---|
| Invention | 5 | 87 | $3 \times 10^6$ |
|  | 10 | 85 | $2 \times 10^6$ |
| Prior art | 4.5 | 83 | $7 \times 10^5$ |
|  | 0.7 | 82 | $5 \times 10^5$ |

The preceding example is set forth to illustrate a specific embodiment of the invention and is not intended to limit the scope of the process of the present invention. Additional embodiments and advantages within the scope of the claimed invention will be apparent to one of ordinary skill in the art.

What is claimed is:

1. A laser-assisted evaporation process for preparing a superconducting oxide thin film, comprising illuminating a surface of a target with pulsive laser light to cause deposition of target molecules on a substrate, wherein the laser light is provided by a CO$_2$ laser or an excimer laser, the incident laser light on the target surface has an energy of from about 5 to 10 J/cm$^2$ per pulse, and the target comprises a sinter of YBa$_2$Cu$_3$O$_{7-x}$.

2. A laser ablation process as defined by claim 1, wherein the laser beam is emitted from a laser apparatus and directed through a condensing means which focuses the laser beam on the target surface.

3. A laser ablation process as defined by claim 2, wherein the condensing means comprises at least one synthetic quartz lens having a non-reflective coating.

4. A laser ablation process as defined by claim 1, wherein the substrate is arranged to face the target.

* * * * *